United States Patent
Huang et al.

(10) Patent No.: US 8,741,693 B2
(45) Date of Patent: Jun. 3, 2014

(54) METHOD FOR MANUFACTURING PACKAGE STRUCTURE WITH MICRO-ELECTROMECHANICAL ELEMENT

(71) Applicant: Siliconware Precision Industries Co., Ltd., Taichung (TW)

(72) Inventors: Chun-An Huang, Taichung (TW); Hsin-Yi Liao, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/078,845

(22) Filed: Nov. 13, 2013

(65) Prior Publication Data

US 2014/0080242 A1    Mar. 20, 2014

Related U.S. Application Data

(62) Division of application No. 12/959,595, filed on Dec. 3, 2010, now Pat. No. 8,610,272.

(30) Foreign Application Priority Data

Nov. 1, 2010    (TW) .............................. 99137432 A

(51) Int. Cl.
*H01L 21/00* (2006.01)
*H01L 29/84* (2006.01)
*H01L 21/50* (2006.01)

(52) U.S. Cl.
CPC ................ *H01L 29/84* (2013.01); *H01L 21/50* (2013.01)
USPC ............................ 438/118; 438/106; 438/456

(58) Field of Classification Search
CPC ................................. H01L 29/84; H01L 21/50
USPC ........................................... 438/118, 106, 456
See application file for complete search history.

(56) References Cited

U.S. PATENT DOCUMENTS

| | | | | |
|---|---|---|---|---|
| 6,469,909 B2 * | 10/2002 | Simmons | ...................... | 361/803 |
| 6,838,776 B2 * | 1/2005 | Leal et al. | ...................... | 257/783 |
| 6,846,725 B2 * | 1/2005 | Nagarajan et al. | ............ | 438/456 |
| 6,919,508 B2 * | 7/2005 | Forcier | ............. | 174/565 |
| 7,011,988 B2 * | 3/2006 | Forcier | ............. | 438/108 |
| 7,361,987 B2 * | 4/2008 | Leal et al. | ...................... | 257/723 |
| 7,372,141 B2 * | 5/2008 | Karnezos et al. | ............. | 257/686 |
| 7,394,148 B2 * | 7/2008 | Karnezos | ...................... | 257/686 |
| 7,429,786 B2 * | 9/2008 | Karnezos et al. | ............. | 257/686 |

(Continued)

*Primary Examiner* — Laura Menz
(74) *Attorney, Agent, or Firm* — Edwards Wildman Palmer LLP; Peter F. Corless; Steven M. Jensen

(57) ABSTRACT

A package structure includes a micro-electromechanical element having a plurality of electrical contacts; a package layer enclosing the micro-electromechanical element and the electrical contacts, with a bottom surface of the micro-electromechanical element exposed from a lower surface of the package layer; a plurality of bonding wires embedded in the package layer, each of the bonding wires having one end connected to one of the electrical contacts, and the other end exposed from the lower surface of the package layer; and a build-up layer structure provided on the lower surface of the package layer, the build-up layer including at least one dielectric layer and a plurality of conductive blind vias formed in the dielectric layer and electrically connected to one ends of the bonding wires. The package structure is easier to accurately control the location of an external electrical contact, and the compatibility of the manufacturing procedures is high.

13 Claims, 5 Drawing Sheets

(56) References Cited

U.S. PATENT DOCUMENTS

| | | | |
|---|---|---|---|
| 7,429,787 B2* | 9/2008 | Karnezos et al. | 257/686 |
| 7,645,634 B2* | 1/2010 | Karnezos | 438/107 |
| 8,072,062 B2* | 12/2011 | Leal et al. | 257/723 |
| 8,227,904 B2* | 7/2012 | Braunisch et al. | 257/686 |
| 8,314,493 B2* | 11/2012 | Kikuchi et al. | 257/738 |
| 8,610,272 B2* | 12/2013 | Huang et al. | 257/738 |
| 2002/0089044 A1* | 7/2002 | Simmons et al. | 257/668 |
| 2002/0089835 A1* | 7/2002 | Simmons | 361/803 |
| 2002/0090749 A1* | 7/2002 | Simmons | 438/64 |
| 2003/0002265 A1* | 1/2003 | Simmons | 361/749 |
| 2004/0077154 A1* | 4/2004 | Nagarajan et al. | 438/455 |
| 2005/0087356 A1* | 4/2005 | Forcier | 174/52.4 |
| 2005/0269687 A1* | 12/2005 | Forcier | 257/701 |
| 2006/0185429 A1 | 8/2006 | Liu et al. | |
| 2006/0220209 A1* | 10/2006 | Karnezos et al. | 257/686 |
| 2006/0220210 A1* | 10/2006 | Karnezos et al. | 257/686 |
| 2006/0244117 A1* | 11/2006 | Karnezos et al. | 257/678 |
| 2006/0284299 A1* | 12/2006 | Karnezos | 257/686 |
| 2007/0273013 A1* | 11/2007 | Kohl et al. | 257/682 |
| 2008/0220563 A1* | 9/2008 | Karnezos | 438/107 |
| 2009/0039489 A1* | 2/2009 | Ting et al. | 257/680 |
| 2010/0307786 A1* | 12/2010 | Kohl et al. | 174/50.51 |
| 2010/0327424 A1* | 12/2010 | Braunisch et al. | 257/692 |
| 2011/0089563 A1* | 4/2011 | Kikuchi et al. | 257/738 |
| 2011/0298126 A1* | 12/2011 | Tsai et al. | 257/738 |
| 2011/0316140 A1* | 12/2011 | Nalla et al. | 257/698 |
| 2012/0104517 A1* | 5/2012 | Huang et al. | 257/415 |
| 2012/0261838 A1* | 10/2012 | Braunisch et al. | 257/777 |
| 2012/0306038 A1* | 12/2012 | Chow et al. | 257/434 |
| 2012/0307215 A1* | 12/2012 | Sano et al. | 355/30 |
| 2013/0119544 A1* | 5/2013 | Nalla et al. | 257/741 |
| 2013/0341803 A1* | 12/2013 | Cheah et al. | 257/774 |

* cited by examiner

METHOD FOR MANUFACTURING PACKAGE STRUCTURE WITH MICRO-ELECTROMECHANICAL ELEMENT

CROSS-REFERENCE TO RELATED APPLICATIONS

This application is a divisional of copending application U.S. Ser. No. 12/959,595, filed on Dec. 3, 2010, which claims under 35 U.S.C. §119(a) the benefit of Taiwanese Application No. 099137432, filed Nov. 1, 2010, the entire contents of which are incorporated herein by reference.

FIELD OF THE INVENTION

The present invention relates to package structures and manufacturing methods thereof, and more particularly, to a package structure having a micro-electromechanical element and a manufacturing method thereof.

BACKGROUND OF THE INVENTION

A micro-electromechanical element system (MEMS) is a micro-device that incorporates both electrical and mechanical functions. The MEMS is manufactured by a variety of microfabrication techniques. A micro-electromechanical element is first provided on the surface of a substrate, and a protective mask or an encapsulant is then encapsulated to protect the micro-electromechanical element from external damage, thereby obtaining a package structure with a micro-electromechanical element.

Referring to FIG. 1, a cross-sectional diagram of a conventional package structure with a micro-electromechanical element is shown. A micro-electromechanical element 11 that functions as a pressure sensing element is disposed on a substrate 10 of land grid array (LGA) type, and an electrical connecting end 111 of the micro-electromechanical element 11 is connected to an electrical connecting end 101 of the LGA substrate 10 through wire bonding, thereby electrically connecting the micro-electromechanical element 11 and the substrate 10. Finally, a metal cap 12 is formed on the surface of the package substrate 10 to encase the micro-electromechanical element 11 therein. The metal cap 12 protects the micro-electromechanical element 11 from external contamination or damage. One shortcoming of the package structure for the micro-electromechanical element is that the size is too large, which fails to meet the need for smaller, lighter and more compact end products.

Refer to FIG. 2. In order to reduce the overall size of the package structure with the micro-electromechanical element, FINEMEMS Inc. has filed a patent application (US patent application publication number 2006/0185429) relating to a wafer-level pressure sensing package substrate. In the package substrate, a micro-electromechanical element 11 that functions as a pressure sensing element is directly manufactured on a silicon substrate 13, and then a glass cap 14 is bonded on the top of the micro-electromechanical element 11.

However, in the silicon substrate 13 a sensing cavity 131 and vias passing through the entire silicon substrate 13 are formed, so a Through Silicon Via (TSV) technique is required. This technique uses KOH as an etchant to form the vias or grooves.

Compared with the first prior-art structure, the structure disclosed by U.S. patent application publication number 2006/0185429 dramatically reduces the overall volume of the package structure with the micro-electromechanical element, but TSV technique for forming vias and grooves is costly.

As a result, as shown in FIG. 3C, modern MEMS industry has developed a package structure that provides an electrical connection path from a micro-electromechanical sensing element 202 on a silicon substrate 20 to the surface of the package structure by bonding wires 221, such that the size of the package structure with the micro-electromechanical element can be greatly reduced, without the need for TSV technique, and manufacturing cost can also be reduced.

Refer to FIGS. 3A to 3C, which are cross-section diagrams depicting the conventional package structure with the micro-electromechanical element and its manufacturing method. The steps of manufacturing this third conventional structure first requires using a plurality of bonding wires 22 to electrically connect a silicon cap 21 and an electrical connecting pad 201 on the silicon substrate 20; enclosing the silicon cap 21 and the bonding wires 22 with a package layer 23 to protect the bonding wires 22 from external damage; and then removing part of the package layer 23 and the bonding wires 22 by lapping to expose the ends of the bonding wires 22. The locations where the ends of the bonding wires 221 are exposed may not be consistent, because the locations where ends of the bonding wires 221 are exposed depend on the curvature and height of bonding. These two parameters have to be precisely controlled to obtain consistency in the locations where the ends of the bonding wires 221 are exposed.

Therefore, there is a need for a technical solution that makes the locations where the ends of the bonding wires are exposed in the package structure with the micro-electromechanical element more consistent while reducing manufacturing cost.

SUMMARY OF THE INVENTION

In light of the forgoing drawbacks, the present invention provides a package structure with a micro-electromechanical element. The package structure includes: a micro-electromechanical element having a plurality of electrical contacts; a package layer enclosing the micro-electromechanical element and the electrical contacts, with a bottom surface of the micro-electromechanical element exposed from a lower surface of the package layer; a plurality of bonding wires embedded in the package layer, each of the bonding wires having one end connected to the electrical contact of the micro-electromechanical, and the other end exposed from the lower surface of the package layer; and a build-up layer structure provided on the lower surface of the package layer, the build-up layer including at least one dielectric layer and a plurality of conductive blind vias formed in the dielectric layer and electrically connected to one ends of the bonding wires.

The present invention further discloses a method for manufacturing a package structure with a micro-electromechanical element. The method includes: preparing a carrier board with a first surface and a second surface opposing to the first surface; providing a plurality of micro-electromechanical elements on the first surface of the carrier board, each of the micro-electromechanical elements having a plurality of electrical contacts; connecting the electrical contacts and the first surface of the carrier board by a plurality of bonding wires; forming a package layer on the first surface of the carrier board to enclose the micro-electromechanical element, the electrical contacts, and the bonding wires; removing the carrier board to expose one end of each of the bonding wires; and forming a build-up layer structure on the surface of the package layer that exposes the bonding wires, the build-up layer including at least one dielectric layer and a plurality of conductive blind vias formed in the dielectric layer and electrically connected to one ends of the bonding wires.

It can be seen from the above, the package structure with the micro-electromechanical element of the present invention first uses the bonding wires to electrically connect to the micro-electromechanical element, and the package layer to enclose the bonding wires and the micro-electromechanical element, and then removes the carrier board to expose one ends of the bonding wires for external electrically connection. Since it is easier to control the locations of the exposed ends of the bonding wires, and the manufacturing method of the present invention is highly compatible with the current build-up layer processes, the overall cost can be favorably reduced.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skill in the art can readily understand the other advantages and functions of the present invention after reading the disclosure of this specification. The present invention can also be implemented with different embodiments. Various details described in this specification can be modified based on different viewpoints and applications without departing from the scope of the present invention.

It should be noted that the structures, proportions and sizes depicted in the attached drawing are intended to illustrate and accompany the disclosure of this specification and to facilitate understanding for those with ordinary skill in the art, they are in no way limit the present invention, and have no substantial meanings. Any structure modification, changes in proportions or adjustment in sizes, without influencing technical effects generated and objectives achieved by the present invention, shall fall within the scope of the technical contents disclosed in the present invention. Meanwhile, terms such as "top", "down", "one" and "a" used herein are convenient usage for descriptions, and in no way limit the implementing scope of the present invention, therefore, changes or modifications of relative relationships, without substantial changes to the technical contents, are construed to be the scope that can be implemented by the present invention.

First Embodiment

Figure 1:
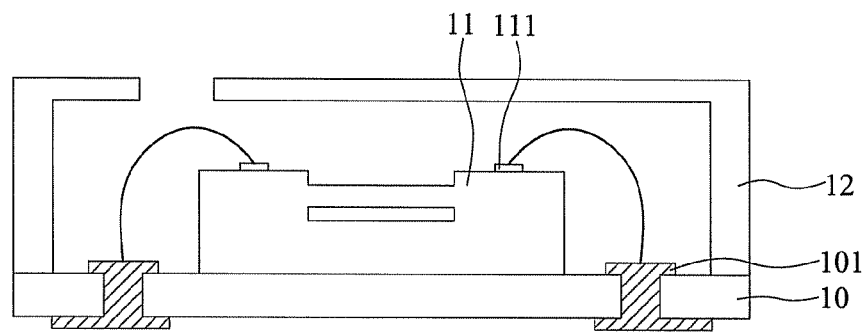
FIG. 1 is a cross-sectional diagram of a conventional package structure with a micro-electromechanical element.
Figure 2:
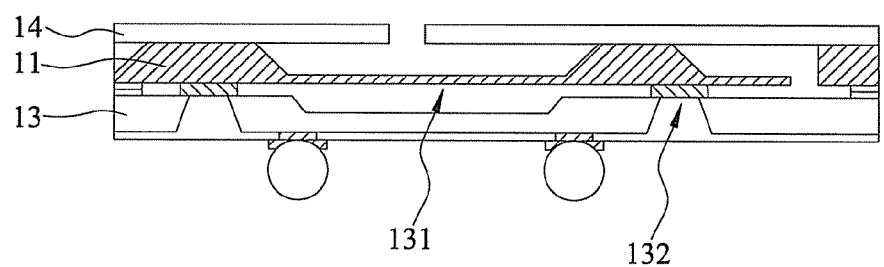
FIG. 2 is a cross-sectional diagram of another conventional package structure with a micro-electromechanical element.
Figure 3A:
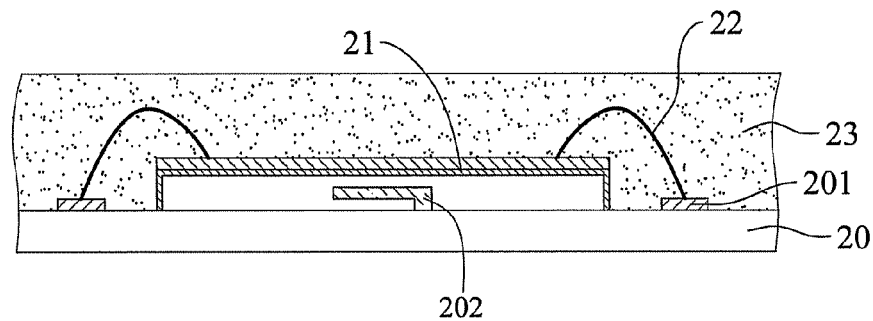
FIGS. 3A to 3C are cross-sectional diagrams depicting yet another conventional package structure with a micro-electromechanical element and its manufacturing.
Figure 3B:
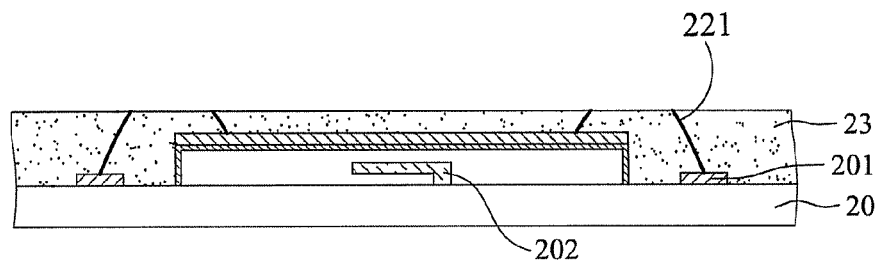
Figure 3C:
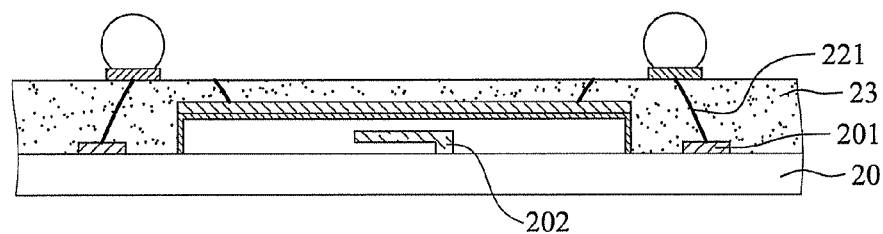
Figure 4A:
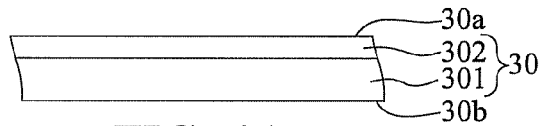
FIGS. 4A to 4G are cross-sectional diagrams depicting a package structure with a micro-electromechanical element and its manufacturing method according to a first embodiment of the present invention, wherein FIGS. 4B' and 4C' are top views of FIGS. 4B and 4C, respectively, and FIG. 4G' is another implementing aspect of FIG. 4G.
Figure 4B:
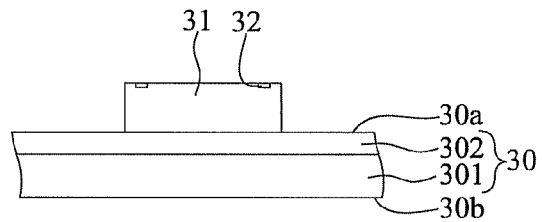
Figure 4B:
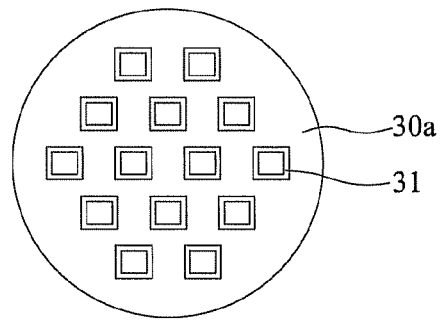

Referring to FIGS. 4A to 4G, cross-sectional diagrams depicting a package structure with a micro-electromechanical element and its manufacturing method according to a first embodiment of the present invention are shown. FIGS. 4B' and 4C' are top views of FIGS. 4B and 4C, and FIG. 4G' is another implementing aspect of FIG. 4G.

As shown in FIG. 4A, a carrier board 30 is prepared that has a first surface 30a and a second surface 30b opposing to the first surface 30a. The carrier board 30 may include a substrate 301 and an adhesive layer 302 attached thereon. The exposed surface of the adhesive layer 302 is the first surface 30a, and the exposed surface of the substrate 301 is the second surface 30b. The substrate 301 can be made of silicon.

As shown in FIGS. 4B and 4B', a plurality of micro-electromechanical elements 31 are provided on the first surface 30a of the carrier board 30. Each of the micro-electromechanical elements 31 has a plurality of electrical contacts 32 provided thereon. The micro-electromechanical elements 31 can be gyroscopes, accelerometers, RF MEMS elements, and the like.

It should be noted that the micro-electromechanical elements 31 may have a cap (not shown) disposed thereon for protection.

Figure 4C:
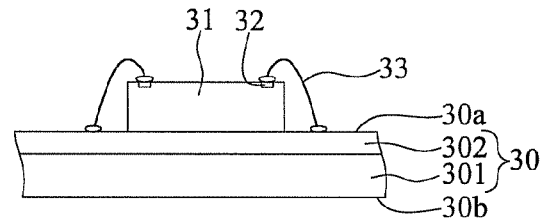
Figure 4C:
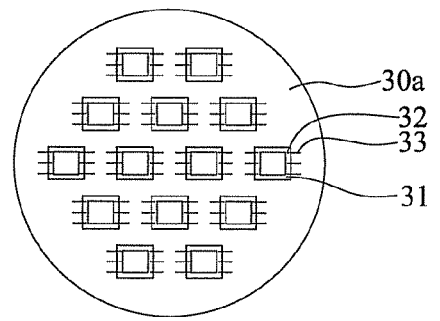

As shown in FIGS. 4C and 4C', a plurality of bonding wires 33 are connected between the electrical contacts 32 and the first surface 30a of the carrier board 30, and one ends of the bonding wires 33 are fixed in place by the adhesive layer 302 on the substrate 301.

Figure 4D:
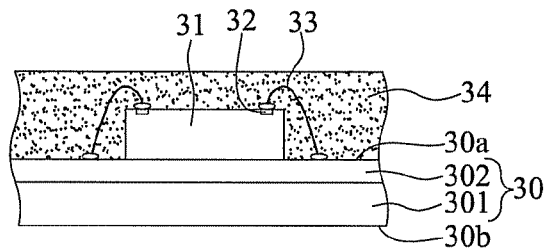

As shown in FIG. 4D, a package layer 34 is formed on the first surface 30a of the carrier board 30 to enclose the micro-electromechanical elements 31, the electrical contacts 32 and the bonding wires 33.

Figure 4E:
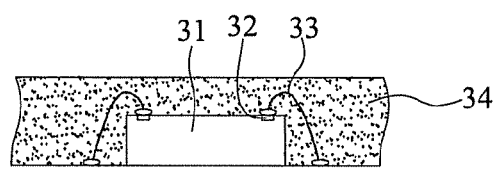

As shown in FIG. 4E, the carrier board 30 is removed to expose one ends of the bonding wires 33, wherein the method for removing the carrier board (separating the adhesive layer 302 and the structure above it) includes irradiation, heating, etching, or lapping.

Figure 4F:
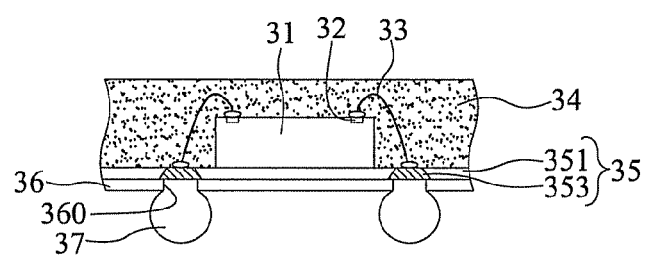

As shown in FIG. 4F, a build-up layer structure 35 is formed on the surface of the package layer 34 that exposes the bonding wires 33. The build-up layer structure 35 includes at least a dielectric layer 351 and a plurality of conductive blind vias 353 formed in the dielectric layer 351 and electrically connected to one ends of the bonding wires 33. A solder resist layer 36 is formed on the build-up layer structure 35. A plurality of solder resist openings 360 are formed in the solder resist layer 36 to expose a portion of the surface of the conductive blind vias 353, and a solder ball 37 is formed on the exposed conductive blind via 353 in each of the solder resist openings 360.

It should be noted that, in the implementing aspect shown in FIG. 4F the solder balls for external electrical connections are disposed directly on the conductive blind vias 353 where bonding wires 33 are exposed. However, in other implementing aspects the build-up layer structure 35 may further include a trace layer 352 on the at least one dielectric layer 351 (referring to FIG. 4G'), and the conductive blind vias 353 electrically connect the trace layer 352 and one ends of the bonding wires 33. A portion of the surface of the trace layer 352 (such as the surface that is not the conductive blind vias 353 end) is exposed from the solder resist openings 360. In other words, one ends of the bonding wires 33 are fanned out by the trace layer 352, and solder balls 37 are formed on the exposed trace layer 352 in the solder resist openings 360

Figure 4G:
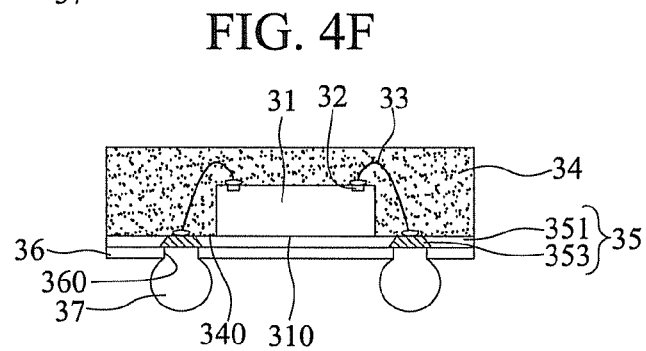
Figure 4G:
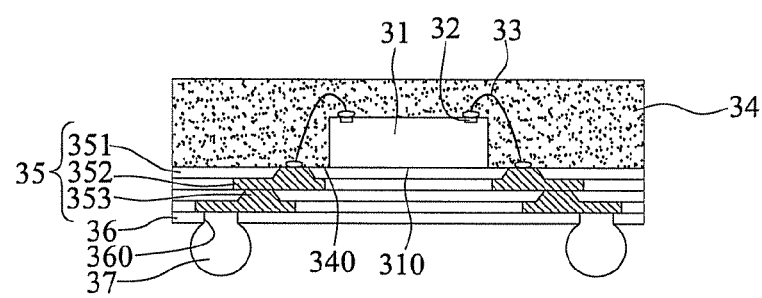
Figure 5A:
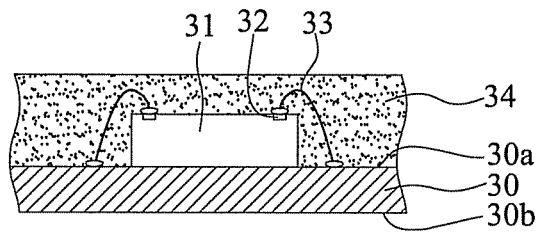
FIGS. 5A to 5D are cross-sectional diagrams depicting a package structure with a micro-electromechanical element and its manufacturing method according to a second embodiment of the present invention.
Figure 5B:
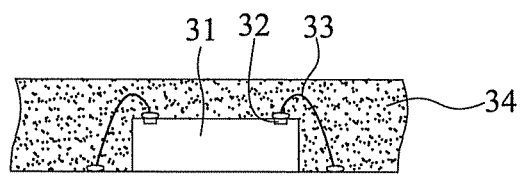
Figure 5C:
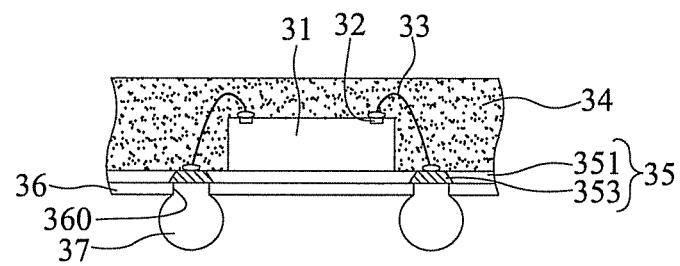
Figure 5D:
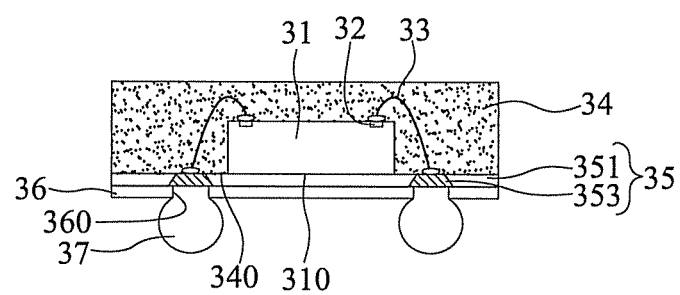

(referring to FIG. 4G'). The above aspects can be easily understood by those with ordinary skill in the art, and will not be further described.

As shown in FIG. 4G, singulation is performed to obtain a plurality of package structures with a micro-electromechanical element.

As shown in FIG. 4G', another implementing aspect in which the build-up layer structure 35 is formed on the surface of the package layer 34 that exposes the bonding wires 33 is provided. In this aspect, the build-up layer structure 35 further includes the trace layer 352 formed on the at least one dielectric layer 351, and the conductive blind vias 353 electrically connect between the trace layer 352 and one ends of the bonding wires 33, thereby completing Redistribution Line (RDL) process.

Second Embodiment

Referring to FIGS. 5A to 5D, cross-sectional diagrams depicting a package structure with a micro-electromechanical element and its manufacturing method according to a second embodiment of the present invention are shown.

The second embodiment is similar to the first embodiment, but the main difference is that the carrier board 30 of the second embodiment is made of a single material, and the material is metal, or preferably aluminum. As such, one ends of the bonding wires 33 can be fixed in place to the metal carrier board 30. The rest is similar to the first embodiment, and will not be described further.

The present invention further discloses a package structure having a micro-electromechanical element. The package structure includes: a micro-electromechanical element 31 having a plurality of electrical contacts 32; a package layer 34 enclosing the micro-electromechanical element 31 and the electrical contacts 32, with a bottom surface 310 of the micro-electromechanical element 31 exposed from a lower surface 340 of the package layer 34; a plurality of bonding wires 33 embedded in the package layer 34, each of the bonding wires 33 having one end connected to the electrical contact 32 of the micro-electromechanical 31, and the other end exposed from the lower surface 340 of the package layer 34; and a build-up layer structure 35 provided on the lower surface 340 of the package layer 34, the build-up layer 35 including at least one dielectric layer 351 and a plurality of conductive blind vias 353 formed in the dielectric layer 351 and electrically connected to one end of the bonding wire 33.

In the above package structure having the micro-electromechanical element, a solder resist layer 36 may be further included on the build-up layer structure 35. The solder resist layer 36 has a plurality of solder resist openings 360 to expose a portion of the surface of the conductive blind vias 353 from these solder resist openings 360.

Moreover, in the above package structure having the micro-electromechanical element, the build-up layer structure 35 may further include a trace layer formed on the at least one dielectric layer 351, and the conductive blind vias 353 are electrically connected between the trace layer and one ends of the bonding wires 33. The package structure may further include a solder resist layer 36 provided on the build-up layer structure 35. The solder resist layer 36 has a plurality of solder resist openings 360 to expose a portion of the surface of the trace layer from these solder resist openings 360.

In the above package structure having the micro-electromechanical element, solder balls 37 may be further included on the exposed trace layer in each solder resist opening 360.

In the above package structure having the micro-electromechanical element, the micro-electromechanical element 31 can be a gyroscope, an accelerometer, a RF MEMS element, and the like.

In conclusion, the package structure with the micro-electromechanical element of the present invention first uses the bonding wires to electrically connect to the micro-electromechanical element, and the package layer to enclose the bonding wires and the micro-electromechanical element, and then removes the carrier board to expose one ends of the bonding wires for external electrically connection. Compared to the prior art, it is easier to control the locations of the exposed ends of the bonding wires, so the overall accuracy and yield can be controlled more easily. Moreover, the manufacturing method of the present invention is highly compatible with the current build-up layer processes, facilitating the reduction of the overall cost.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for manufacturing a package structure having a micro-electromechanical element, comprising:
   preparing a carrier board having a first surface and a second surface opposing the first surface;
   providing a plurality of micro-electromechanical elements on the first surface of the carrier board, each of the micro-electromechanical elements having a plurality of electrical contacts;
   connecting the electrical contacts and the first surface of the carrier board by a plurality of bonding wires;
   forming a package layer on the first surface of the carrier board to enclose the micro-electromechanical element, the electrical contacts, and the bonding wires;
   removing the carrier board to expose one end of each of the bonding wires; and
   forming a build-up layer structure on the surface of the package layer that exposes the bonding wires, the build-up layer including at least one dielectric layer and a plurality of conductive blind vias formed in the dielectric layer and electrically connected to one ends of the bonding wires.

2. The method of claim 1, wherein the carrier board further includes a substrate and an adhesive layer attached thereon, the exposed surface of the adhesive layer is the first surface, and the exposed surface of the substrate is the second surface.

3. The method of claim 2, wherein the substrate is a material containing silicon.

4. The method of claim 1, further comprising forming a solder resist layer having a plurality of solder resist openings on the build-up layer structure to expose a portion of the surface of the conductive blind vias from the solder resist openings.

5. The method of claim 4, further comprising forming a solder ball on the exposed conductive blind via in each of the solder resist openings.

6. The method of claim 5, further comprising performing singulation to obtain a plurality of package structures each with the micro-electromechanical element.

7. The method of claim 1, wherein the build-up layer structure further includes a trace layer on the at least one dielectric layer, and the conductive blind vias electrically connect the trace layer and one ends of the bonding wires.

8. The method of claim 7, further comprising forming a solder resist layer having a plurality of solder resist openings on the build-up layer structure to expose a portion of the surface of the trace layer from the solder resist openings.

9. The method of claim 8, further comprising forming a solder ball provided on the exposed trace layer in each of the solder resist openings.

10. The method of claim 9, further comprising performing singulation to obtain a plurality of package structures each with the micro-electromechanical element.

11. The method of claim 1, wherein the material of the carrier board is aluminum.

12. The method of claim 1, wherein removing the carrier board includes irradiation, heating, etching, or lapping.

13. The method of claim 1, wherein the micro-electromechanical element is a gyroscope, an accelerometer, or an RF MEMS element.

* * * * *